(12) United States Patent
Moriwaki

(10) Patent No.: US 12,439,768 B2
(45) Date of Patent: Oct. 7, 2025

(54) PHOTOELECTRIC CONVERSION PANEL, X-RAY IMAGING PANEL, AND MANUFACTURING METHOD OF PHOTOELECTRIC CONVERSION PANEL

(71) Applicant: Sharp Display Technology Corporation, Kameyama (JP)

(72) Inventor: Hiroyuki Moriwaki, Kameyama (JP)

(73) Assignee: Sharp Display Technology Corporation, Kameyama (JP)

( * ) Notice: Subject to any disclaimer, the term of this patent is extended or adjusted under 35 U.S.C. 154(b) by 430 days.

(21) Appl. No.: 18/092,679

(22) Filed: Jan. 3, 2023

(65) Prior Publication Data
US 2023/0232643 A1    Jul. 20, 2023

(30) Foreign Application Priority Data
Jan. 6, 2022  (JP) .................................. 2022-001335

(51) Int. Cl.
| | |
|---|---|
| H10K 39/32 | (2023.01) |
| G01T 1/20 | (2006.01) |
| H10K 30/81 | (2023.01) |
| H10K 71/60 | (2023.01) |

(52) U.S. Cl.
CPC ......... *H10K 39/32* (2023.02); *G01T 1/20187* (2020.05); *H10K 30/81* (2023.02); *H10K 71/60* (2023.02)

(58) Field of Classification Search
None
See application file for complete search history.

(56) References Cited

U.S. PATENT DOCUMENTS

2019/0305025 A1    10/2019  Moriwaki

FOREIGN PATENT DOCUMENTS

JP    2019-174366 A    10/2019

*Primary Examiner* — Anthony Ho
(74) *Attorney, Agent, or Firm* — ScienBiziP, P.C.

(57) ABSTRACT

A photoelectric conversion panel includes a TFT, a photodiode disposed at an upper layer than the TFT, a first organic film formed at an upper layer than the photodiode, a first inorganic insulating film covering at least a part of the first organic film, and a second organic film covering at least a part of the first inorganic insulating film. The first inorganic insulating film includes a first hole portion connecting the first organic film and the second organic film, and a first moisture-proof portion at least a part of which is disposed at a side of the photodiode with respect to the first hole portion. The first moisture-proof portion penetrates the first organic film.

9 Claims, 7 Drawing Sheets

PHOTOELECTRIC CONVERSION PANEL, X-RAY IMAGING PANEL, AND MANUFACTURING METHOD OF PHOTOELECTRIC CONVERSION PANEL

CROSS-REFERENCE TO RELATED APPLICATIONS

This application claims the benefit of priority to Japanese Patent Application Number 2022-001335 filed on Jan. 6, 2022. The entire contents of the above-identified application are hereby incorporated by reference.

BACKGROUND

Technical Field

The disclosure relates to a photoelectric conversion panel, an X-ray imaging panel, and a manufacturing method of a photoelectric conversion panel.

Typically, photoelectric conversion panels including thin film transistors and photoelectric conversion elements are known. Such a photoelectric conversion panel is disclosed in, for example, JP 2019-174366 A.

JP 2019-174366 A discloses an imaging panel including a thin film transistor and a photoelectric conversion element. The imaging panel includes an active matrix substrate including a photoelectric conversion element in each of a plurality of pixels, a scintillator, a moisture-proof material covering the active matrix substrate and the scintillator, and an adhesive layer that adheres the moisture-proof material to the scintillator and to the active matrix substrate. Further, the active matrix substrate includes an organic film formed at an upper layer than the thin film transistor, and an inorganic insulating film formed at an upper layer than the organic layer and an upper layer than the photoelectric conversion element. Here, when moisture enters into the thin film transistor and the imaging panel, the characteristics deteriorate. In contrast, the imaging panel of JP 2019-174366 A is provided with a groove having an annular shape in a plan view, the groove being configured to prevent moisture from entering from the outer periphery of the imaging panel.

SUMMARY

Here, when the photoelectric conversion panel is manufactured, hydrogen gas may be generated from the organic layer due to the temperature rise of the photoelectric conversion panel. Due to this hydrogen gas, there is a problem that a semiconductor in the thin film transistor is reduced, and a threshold voltage of the thin film transistor is shifted in a negative direction. In contrast, in order to release the hydrogen gas generated from the organic film to the outside, a hole portion may be provided in the inorganic film formed at the upper layer than the organic layer, but moisture enters through the hole portion, and characteristics of the photoelectric conversion element change due to the moisture. For example, there is a problem that an off-leak current of the photoelectric conversion element increases.

Thus, the disclosure has been made to solve the above-described problems, and an object of the disclosure is to provide a photoelectric conversion panel and an X-ray imaging panel that are capable of preventing characteristics of both the thin film transistor and the photoelectric conversion element from changing, and a manufacturing method of the photoelectric conversion panel.

To solve the problems described above, a photoelectric conversion panel according to a first aspect of the disclosure includes a substrate, a thin film transistor disposed on the substrate, a photoelectric conversion element disposed at an upper layer than the thin film transistor, a first organic film formed at an upper layer than the photoelectric conversion element, a first inorganic insulating film covering at least a part of the first organic film, and a second organic film covering at least a part of the first inorganic insulating film, and the first inorganic insulating film includes a first hole portion connecting the first organic film and the second organic film, and a first moisture-proof portion at least a part of which is disposed at a side of the photoelectric conversion element with respect to the first hole portion, the first moisture-proof portion penetrating the first organic film.

An X-ray imaging panel according to a second aspect includes the photoelectric conversion panel according to the first aspect, and a scintillator overlapping the photoelectric conversion panel.

A manufacturing method of a photoelectric conversion panel according to a third aspect includes forming a thin film transistor on a substrate, forming a photoelectric conversion element at an upper layer than the thin film transistor, forming a first organic film at an upper layer than the photoelectric conversion element, forming a first inorganic insulating film covering at least a part of the first organic film, forming a first hole portion in the first inorganic insulating film, and forming a second organic film covering at least a part of the first inorganic insulating film and connecting the second organic film and the first organic film in the first hole portion, and the forming of the first inorganic insulating film includes forming a first moisture-proof portion at least a part of which is disposed at a side of the photoelectric conversion element with respect to the first hole portion, the first moisture-proof portion penetrating the first organic film.

According to the configuration described above, even when hydrogen gas is generated from the first organic film in manufacturing the photoelectric conversion panel, the hydrogen gas can be released to an upper layer than the first inorganic insulating film through the first hole portion provided in the first inorganic insulating film. This can suppress the hydrogen gas from entering into the thin film transistor disposed at a lower layer than the first organic film, and thus, can prevent characteristics of the thin film transistor from changing. In addition, the first moisture-proof portion at least the part of which is disposed at the side of the photoelectric conversion element with respect to the first hole portion penetrates the first organic film, and the first organic film is blocked. Thus, even when moisture enters from the first hole portion, the moisture is prevented from arriving at or in the photoelectric conversion element. As a result, characteristics of the photoelectric conversion element can be prevented from changing.

BRIEF DESCRIPTION OF DRAWINGS

The disclosure will be described with reference to the accompanying drawings, wherein like numbers reference like elements.

DESCRIPTION OF EMBODIMENTS

Figure 1:
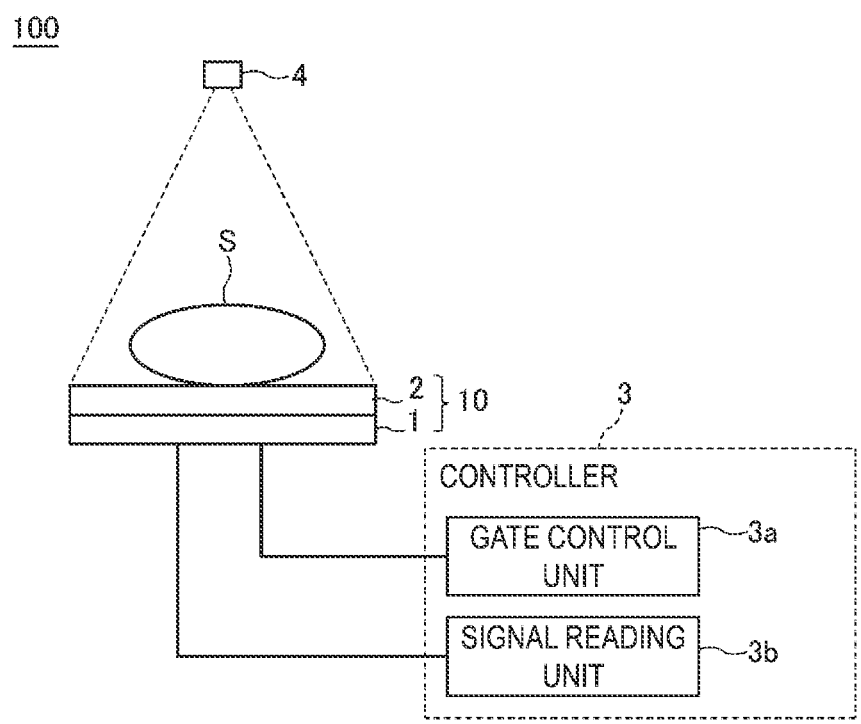
FIG. 1 is a schematic view illustrating an X-ray imaging device 100 provided with an X-ray imaging panel 10 including a photoelectric conversion panel 1 according to a first embodiment.

Embodiments of the disclosure will be described below with reference to the drawings. Note that the disclosure is not limited to the following embodiments, and appropriate design changes can be made within a scope that satisfies the configuration of the disclosure. Further, in the description below, the same reference signs are used in common among the different drawings for the same portions or portions having similar functions, and repetitive descriptions thereof will be omitted. Further, the configurations described in the embodiments and the modified examples may be combined or modified as appropriate within a range that does not depart from the gist of the disclosure. Further, for ease of explanation, in the drawings referenced below, the configuration is simplified or schematically illustrated, or some constituent members are omitted. Further, dimensional ratios between constituent members illustrated in the drawings are not necessarily indicative of actual dimensional ratios.

First Embodiment

FIG. 1 is a schematic view illustrating an X-ray imaging device 100 provided with an X-ray imaging panel 10 including a photoelectric conversion panel 1 according to a first embodiment. The X-ray imaging device 100 is provided with the X-ray imaging panel 10 including the photoelectric conversion panel 1 and a scintillator 2 disposed so as to overlap the photoelectric conversion panel 1. Further, the X-ray imaging device 100 is provided with a controller 3. The controller 3 includes a gate control unit 3a and a signal reading unit 3b. A subject S is irradiated with X-rays from an X-ray source 4. X-rays passing through the subject S are converted into fluorescence (hereinafter, referred to as "scintillation light") in the scintillator 2 disposed at an upper portion of the photoelectric conversion panel 1. The X-ray imaging device 100 acquires an X-ray image by the controller 3 by imaging the scintillation light with the X-ray imaging panel 10.

Figure 2:
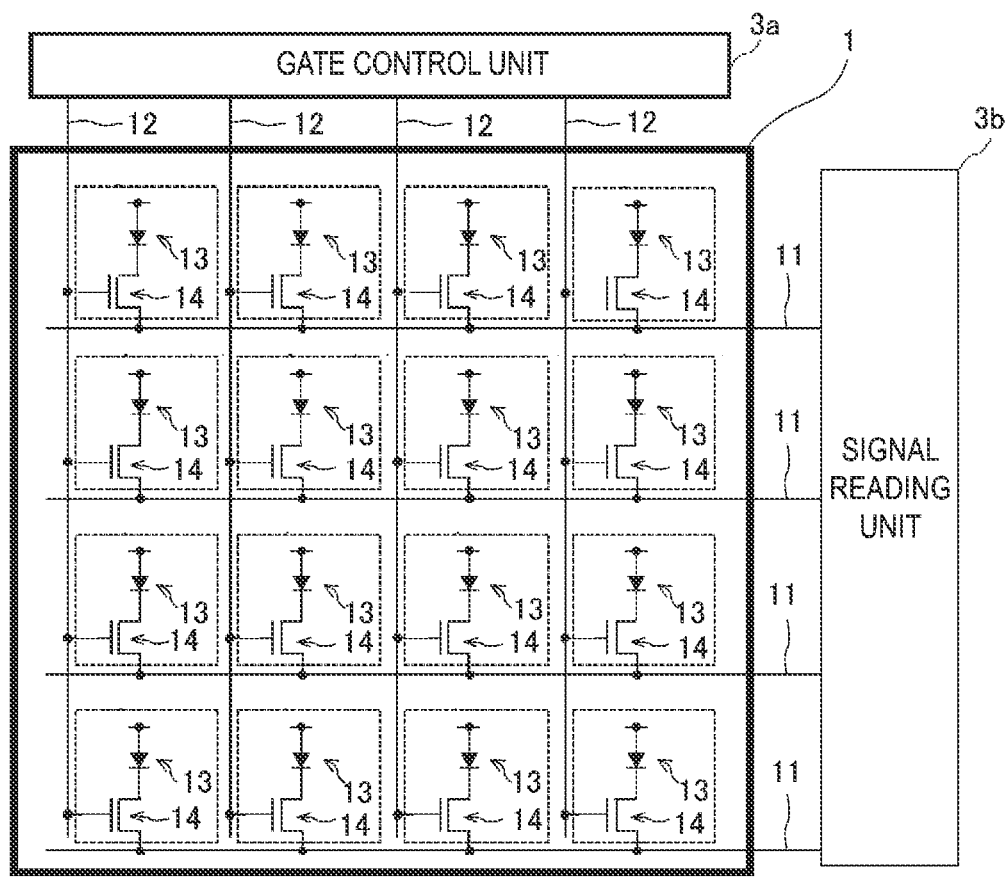
FIG. 2 is a schematic view illustrating a schematic configuration of the photoelectric conversion panel 1.

FIG. 2 is a schematic view illustrating a schematic configuration of the photoelectric conversion panel 1. As illustrated in FIG. 2, the photoelectric conversion panel 1 is formed with a plurality of source wiring lines 11 (data wiring lines) and a plurality of gate wiring lines 12 intersecting the plurality of source wiring lines 11. The gate wiring lines 12 are connected to the gate control unit 3a, and the source wiring lines 11 are connected to the signal reading unit 3b.

The photoelectric conversion panel 1 is provided with a photodiode 13 (photoelectric conversion element) in each of regions (pixels) surrounded by the source wiring lines 11 and the gate wiring lines 12. The photoelectric conversion panel 1 is further provided with a Thin Film Transistor (TFT) 14 connected to the source wiring line 11 and the gate wiring line 12 at a position where the source wiring line 11 and the gate wiring line 12 intersect with each other. The photodiode 13 converts scintillation light into electric charges depending on a light amount of the scintillation light.

Figure 3:
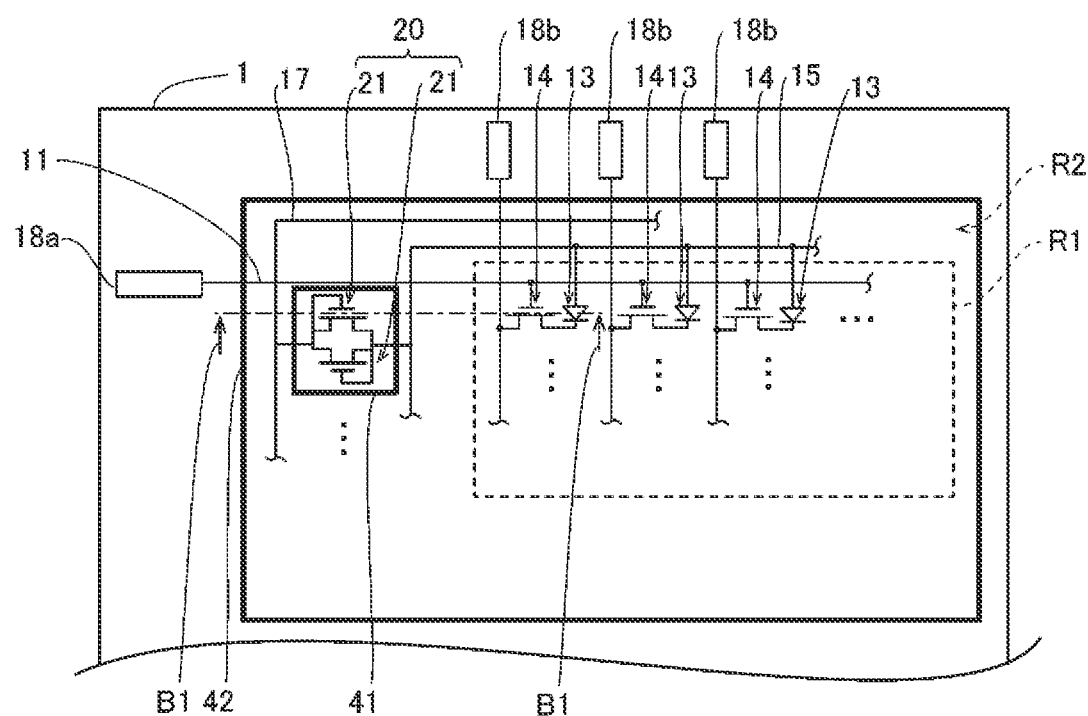
FIG. 3 is a schematic view illustrating a partial structure of the photoelectric conversion panel 1.

FIG. 3 is a schematic view illustrating a partial structure of the photoelectric conversion panel 1. As illustrated in FIG. 3, the photoelectric conversion panel 1 includes a bias wiring line 15, a ground wiring line 17, a protection circuit 20 connected to the bias wiring line 15 and the ground wiring line 17, gate terminals 18a, and source terminals 18b. The bias wiring line 15 is connected to an anode of each photodiode 13. Then, the bias wiring line 15 is connected to a bias power source (not illustrated), and the bias wiring line 15 supplies a bias voltage from the bias power source to each photodiode 13. Also, a cathode of the photodiode 13 is connected to the TFT 14.

Further, as illustrated in FIG. 3, the gate terminal 18a is connected with the gate wiring line 12, and is connected to the gate control unit 3a (see FIG. 2) through a wiring line, or a flexible printed circuit board (not illustrated), or the like. The source terminal 18b is connected with the source wiring line 11, and is connected to the signal reading unit 3b (see FIG. 2) through a wiring line, or a flexible printed circuit board (not illustrated), or the like. The gate terminals 18a and the source terminals 18b are disposed on the photoelectric conversion panel 1 in a region R2 outside a pixel region R1 in which the photodiodes 13 and the TFTs 14 are disposed.

In addition, as illustrated in FIG. 3, the ground wiring line 17 and the protection circuit 20 are disposed on the photoelectric conversion panel 1 in the region R2. Additionally, the ground wiring line 17 and the protection circuit 20 are disposed in the region R2 at a position at the pixel region R1 side than the gate terminal 18a and the pixel region R1 side than the source terminal 18b. A potential of the ground wiring line 17 is a ground potential. The protection circuit 20 includes a plurality of TFTs 21. Then, when static electricity enters from one of the bias wiring line 15 and the ground wiring line 17, the protection circuit 20 releases the static electricity to the other. Note that, in FIG. 3, two TFTs 21 are illustrated in the protection circuit 20, but the number of TFTs may be one, or three or more.

Each of the gate wiring lines 12 in the photoelectric conversion panel 1 is sequentially switched to a selected state in the gate control unit 3a, and the TFT 14 connected to the gate wiring line 12 in the selected state becomes an on state. When the TFT 14 is in the on state, a signal corresponding to electric charges converted in the photodiode 13 is output to the signal reading unit 3b through the source wiring line 11.

Figure 4:
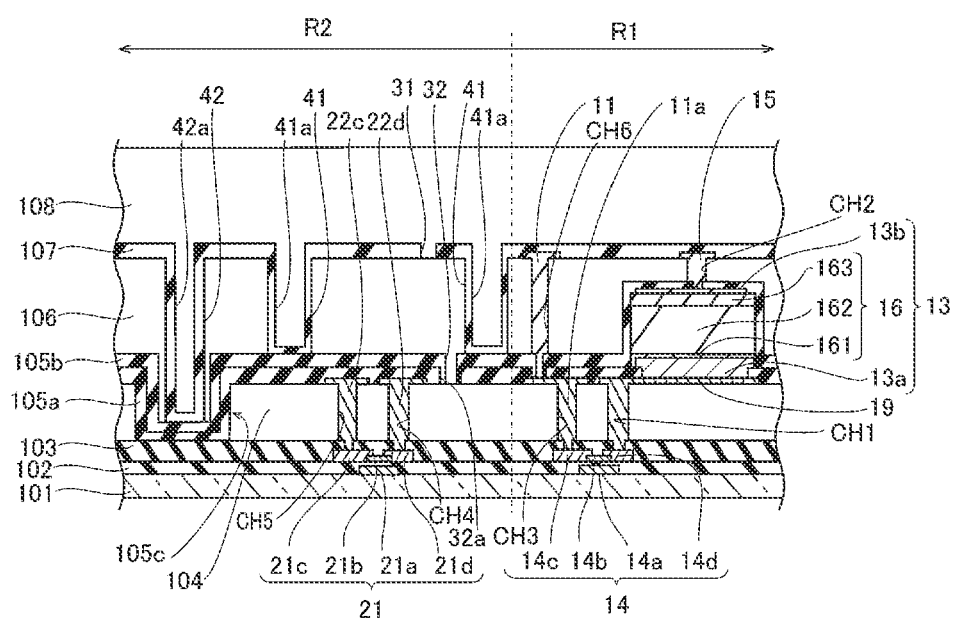
FIG. 4 is a cross-sectional view taken along a line B1-B1 in FIG. 3.

FIG. 4 is a cross-sectional view taken along a line B1-B1 in FIG. 3. As illustrated in FIG. 4, the photoelectric conversion panel 1 is provided with a first lower electrode 19 connected to the TFT 14. The photodiode 13 includes a second lower electrode 13a and an upper electrode 13b, and a photoelectric conversion layer 16. The photoelectric conversion layer 16 is provided between the upper electrode 13b, and the first lower electrode 19 and the second lower electrode 13a.

Additionally, the TFT 14 includes a gate electrode 14a integrated with the gate wiring line 12, a semiconductor active layer 14b, a source electrode 14c connected to the source wiring line 11, and a drain electrode 14d. The drain electrode 14d and the second lower electrode 13a are connected through the first lower electrode 19 provided in a contact hole CH1. The bias wiring line 15 is partially provided in a contact hole CH2, and supplies the bias voltage to the photodiode 13 through the contact hole CH2. The source electrode 14c is connected to the source wiring line 11 through a source connection electrode 11a, which will be described below, provided in a contact hole CH3.

Further, as illustrated in FIG. 4, the photoelectric conversion panel 1 includes a glass substrate 101, a first organic film 106, a second organic film 108, a third organic film 104, a first inorganic insulating film 107, a second lower inorganic insulating film 105a, a second upper inorganic insulating film 105b, a third inorganic insulating film 103, and a gate insulating film 102.

Here, in the first embodiment, as illustrated in FIG. 4, the first inorganic insulating film 107 is provided with a first hole portion 31 that allows gas (for example, hydrogen gas) to pass through in manufacturing the photoelectric conversion panel 1. A part of the second organic film 108 is disposed in the first hole portion 31, and the first organic film 106 and the second organic film 108 are connected in the first hole portion 31. Thus, even when hydrogen gas is generated from the first organic film 106 in manufacturing the photoelectric conversion panel 1, the hydrogen gas can be released to the upper layer than the first inorganic insulating film 107 through the first hole portion 31 provided in the first inorganic insulating film 107. This can suppress the hydrogen gas from entering into the TFT 21 disposed at the lower layer than the first organic film 106, so that characteristics of the TFT 21 can be prevented from changing.

Additionally, the second lower inorganic insulating film 105a and the second upper inorganic insulating film 105b are provided with a second hole portion 32 that allows gas (for example, hydrogen gas) to pass through in manufacturing the photoelectric conversion panel 1. A part of the first organic film 106 is disposed in the second hole portion 32, and the first organic film 106 and the third organic film 104 are connected in the second hole portion 32. This can release hydrogen gas generated from the third organic film 104 through the second hole portion 32 to an upper layer than the second lower inorganic insulating film 105a and the second upper inorganic insulating film 105b. Furthermore, even when the second hole portion 32 is provided in the second lower inorganic insulating film 105a and the second upper inorganic insulating film 105b, moisture that has entered the third organic film 104 through the second hole portion 32 is blocked by the first lower electrode 19 before arriving at or in the photodiode 13. Thus, changing in characteristics of the photodiode 13 due to the moisture can be prevented.

Also, the first inorganic insulating film 107 includes a first moisture-proof portion 41 and a second moisture-proof portion 42. At least a part of the first moisture-proof portion 41 is disposed at the photodiode 13 side with respect to the first hole portion 31. As illustrated in FIG. 3, the first moisture-proof portion 41 has a frame-like shape surrounding at least the TFT 21 of the protection circuit 20 in a plan view. For example, the first moisture-proof portion 41 has a rectangular frame-like shape surrounding the entire protection circuit 20 in a plan view. Further, as illustrated in FIG. 4, the first moisture-proof portion 41 has a shape surrounding the first hole portion 31 and the second hole portion 32 in a plan view. Additionally, the first moisture-proof portion 41 penetrates the first organic film 106 in a thickness direction. For example, the first moisture-proof portion 41 includes a groove 41a recessed from a height position where the first hole portion 31 is provided, toward the second upper inorganic insulating film 105b. Also, the groove 41a is filled with a part of the second organic film 108. Then, a lower end of the first moisture-proof portion 41 is in contact with an upper surface of the second upper inorganic insulating film 105b.

According to the configuration of the first moisture-proof portion 41, the first organic film 106 is blocked by the first moisture-proof portion 41 at least a part of which is disposed closer to the photodiode 13 than the first hole portion 31 is, and thus, even when moisture enters from the first hole portion 31, the moisture can be prevented from arriving at or in the photodiode 13. As a result, characteristics of the photodiode 13 can be prevented from changing. Furthermore, since the first moisture-proof portion 41 has a frame shape, moisture that has entered into the first organic film 106 through the first hole portion 31 can be prevented from entering into a region outside the first moisture-proof portion 41 having the frame shape.

Also, the number per unit area (density) of TFTs 21 in the region R2 is smaller than the number per unit area (density) of TFTs 14 in the pixel region R1. Thus, intervals between the plurality of TFTs 21 are larger than intervals between the plurality of TFTs 14. Thus, there is generated a difference between a density of a source electrode 21c and a drain electrode 21d that constitute the TFT 21 in the region R2 and a density of the source electrode 14c and the drain electrode 14d that constitute the TFT 14 in the pixel region R1. Because of this, in the region R2 with a low density, a taper shape of an end portion of the electrode deteriorates due to a loading effect in dry etching of the source electrode and the drain electrode (inclination becomes steep), a coverage with respect to the source electrode and the drain electrode by a passivation film becomes poor, hydrogen gas is likely to enter into a channel portion through the portion having the poor coverage, and characteristics of the TFT are significantly degraded, as compared to the region R1. In order to compensate for this problem, according to the above-described configuration, the hydrogen gas can be released through the first hole portion 31 and the second hole portion 32, and thus, characteristics of the TFT 21 in the protection circuit 20 can be prevented from changing. Then, the first hole portion 31 and the second hole portion 32 are disposed inside the first moisture-proof portion 41 surrounding the TFT 21 in the protection circuit 20 in a plan view, and thus, moisture that has entered through the first hole portion 31 can be prevented from arriving at or in the photodiode 13 beyond the first moisture-proof portion 41.

As illustrated in FIG. 3, the second moisture-proof portion 42 is disposed in a region outside the first moisture-proof portion 41 and the protection circuit 20 in the region R2. Additionally, the second moisture-proof portion 42 has a frame shape surrounding the pixel region R1 provided with the first moisture-proof portion 41 and the photodiode 13. Additionally, as illustrated in FIG. 4, the second moisture-proof portion 42 is disposed in a region opposite to the pixel region R1 with respect to the first moisture-proof portion 41 in the region R2. Then, the second moisture-proof portion 42 penetrates the first organic film 106 in the thickness direction. For example, the second moisture-proof portion 42 includes a groove 42a recessed from a height position where the first hole portion 31 is provided, toward the second upper inorganic insulating film 105b. Also, the groove 42a is filled with a part of the second organic film 108. Then, a lower end of the second moisture-proof portion 42 is in contact with the upper surface of the second upper inorganic insulating film 105b. Additionally, a part of the second moisture-proof portion 42 is disposed inside a groove 105c formed in the second upper inorganic insulating film 105b and the second lower inorganic insulating film 105a. The groove 105c is formed by recessing a part of the second upper inorganic insulating film 105*b* and the second lower inorganic insulating film 105*a* toward the third inorganic insulating film 103. The lower end of a portion where the groove 105*c* is formed, of the second upper inorganic insulating film 105*b* and the second lower inorganic insulating film 105*a*, is in contact with the upper surface of the third inorganic insulating film 103.

According to the configuration of the second moisture-proof portion 42, moisture that has entered from the outer periphery of the photoelectric conversion panel 1 can be blocked by the second moisture-proof portion 42, and thus, changing in characteristics of the photodiode 13 due to the moisture that has entered from the outer periphery of the photoelectric conversion panel 1 can be prevented.

Configuration of Thin Film Transistor

As illustrated in FIG. 4, the gate electrodes 14*a* and 21*a*, and the gate insulating film 102 are formed on the glass substrate 101. The glass substrate 101 is a substrate with an insulating property. The gate electrodes 14*a* and 21*a* are formed as layered films containing tungsten (W) and tantalum nitride (TaN), for example, as materials.

The gate insulating film 102 covers the gate electrodes 14*a* and 21*a*. For the gate insulating film 102, for example, silicon oxide (SiOx), silicon nitride (SiNx), silicon oxynitride (SiOxNy) (x>y), silicon nitride oxide (SiNxOy) (x>y), and the like may be used. In the first embodiment, the gate insulating film 102 is configured by layering an insulating film formed of silicon oxide (SiOx) as an upper layer and an insulating film formed of silicon nitride (SiNx) as a lower layer.

The semiconductor active layers 14*b* and 21*b* are respectively provided on the gate electrodes 14*a* and 21*a* with the gate insulating film 102 interposed therebetween. Then, the source electrode 14*c* and the drain electrode 14*d* connected to the semiconductor active layer 14*b*, and the source electrode 21*c* and the drain electrode 21*d* connected to the semiconductor active layer 21*b* are provided on the gate insulating film 102.

Each of the semiconductor active layers 14*b* and 21*b* is in contact with the gate insulating film 102. The semiconductor active layers 14*b* and 21*b* are constituted by oxide semiconductors. In the first embodiment, the oxide semiconductor includes an In—Ga—Zn—O based oxide semiconductor. In detail, as the oxide semiconductor, for example, $InGaO_3(ZnO)_5$, magnesium zinc oxide (MgxZn1-xO), cadmium zinc oxide (CdxZn1-xO), cadmium oxide (CdO), an amorphous oxide semiconductor containing indium (In), gallium (Ga), and zinc (Zn) at a predetermined ratio, or the like may be used. According to this configuration, an oxidation action by the third organic film 104 with respect to the TFTs 14 and 21 and a reduction action by the second lower inorganic insulating film 105*a* (silicon nitride) with respect to the TFTs 14 and 21 are optimized, so that turning a current-voltage characteristic (I-V characteristic) of the TFT into a depletion type can be suppressed. Furthermore, the TFTs 14 and 21 can be made to have high speed performance.

The source electrode 14*c* and the drain electrode 14*d* are disposed to be in contact with a part of the semiconductor active layer 14*b* on the gate insulating film 102. The source electrode 21*c* and the drain electrode 21*d* are disposed to be in contact with a part of the semiconductor active layer 21*b* on the gate insulating film 102. The source electrode 14*c* is connected to the source connection electrode 11*a* a part of which is disposed in the contact hole CH3. The source connection electrode 11*a* is connected to the source wiring line 11. The drain electrode 14*d* is connected to the first lower electrode 19 a part of which is disposed in the contact hole CH1. The source electrode 21*c* is connected to a source connection electrode 22*c* a part of which is disposed in a contact hole CH5. The source connection electrode 22*c* is connected to the ground wiring line 17 (see FIG. 3). The drain electrode 21*d* is connected to a drain connection electrode 22*d* a part of which is disposed in a contact hole CH4. The drain connection electrode 22*d* is connected to the bias wiring line 15 (see FIG. 3). Also, the source electrodes 14*c* and 21*c* and the drain electrodes 14*d* and 21*d* are formed in the same layer. The source electrodes 14*c* and 21*c* and the drain electrodes 14*d* and 21*d* have a triple-layer structure layered such that two metal films made of titanium (Ti) sandwich a metal film made of aluminum (Al), for example.

The third inorganic insulating film 103 is provided to overlap the source electrode 14*c* and the drain electrode 14*d* on the gate insulating film 102. The third inorganic insulating film 103 includes a first opening (contact portion) on the drain electrode 14*d* and includes a second opening (contact portion) on the source electrode 14*c*. In this example, the third inorganic insulating film 103 is configured of, for example, an inorganic insulating film (a single-layer film, a layered film) made of silicon oxide ($SiO_2$), or a nitride film (SiNx).

Configuration of Third Organic Film

The third organic film 104 is provided on the third inorganic insulating film 103. In other words, the third organic film 104 is formed at an upper layer than the TFT 14. Thus, the third organic film 104 has a function as a flattening film of the TFT 14. The third organic film 104 and the third inorganic insulating film 103 include the contact hole CH1 formed on the drain electrode 14*d*, the contact hole CH3 formed on the source electrode 14*c*, the contact hole CH4 formed on the drain electrode 21*d*, and the contact hole CH5 formed on the source electrode 21*c*. The third organic film 104 is made of, for example, organic transparent resin such as acrylic resin or siloxane resin. In the first embodiment, the third organic film 104 is made of photosensitive acrylic resin.

Configurations of First Lower Electrode, Source Connection Electrode, and Drain Connection Electrode The first lower electrode 19, the source connection electrodes 11*a* and 22*c*, and the drain connection electrode 22*d* are provided on the third organic film 104. A part of the first lower electrode 19 is formed in the contact hole CH1, and the first lower electrode 19 connects the drain electrode 14*d* and the second lower electrode 13*a*. A part of the source connection electrode 11*a* is formed in the contact hole CH3, and the source connection electrode 11*a* connects the source electrode 14*c* and the source wiring line 11. A part of the source connection electrode 22*c* is formed in the contact hole CH5. A part of the drain connection electrode 22*d* is formed in the contact hole CH4. The first lower electrode 19, the source connection electrodes 11*a* and 22*c*, and the drain connection electrode 22*d* have a triple-layer structure layered such that two metal films made of titanium (Ti) and having different film thicknesses from each other (100 nm and 50 nm) sandwich a metal film (300 nm) made of aluminum (Al). Note that the first lower electrode 19, the source connection electrodes 11*a* and 22*c*, and the drain connection electrode 22*d* may be constituted by a single-layer structure made of aluminum. Here, the first lower electrode 19, the source connection electrodes 11*a* and 22*c*, and the drain connection electrode 22*d* contain aluminum. Thus, the first lower electrode 19, the source connection electrodes 11*a* and 22*c*, and the drain connection electrode

22d have relatively low resistance values, because aluminum has a relatively small resistance value.

Configuration of Second Lower Inorganic Insulating Film

The second lower inorganic insulating film 105a covering a part of the first lower electrode 19 and a part of the third organic film 104 is provided on the first lower electrode 19. A hole portion 32a is provided at a position where the second hole portion 32 is formed in the second lower inorganic insulating film 105a. For the second lower inorganic insulating film 105a, for example, silicon oxide (SiOx), silicon nitride (SiNx), silicon oxynitride (SiOxNy) (x>y), silicon nitride oxide (SiNxOy) (x>y), and the like may be used. In the first embodiment, the second lower inorganic insulating film 105a is made of silicon oxynitride (SiNx). Further, the second lower inorganic insulating film 105a is provided with an opening provided with the second lower electrode 13a on the first lower electrode 19. Further, the second lower inorganic insulating film 105a is provided with a contact hole CH6 in which a part of the source wiring line 11 is provided on the source connection electrode 11a. A film thickness of the second lower inorganic insulating film 105a is equal to or larger than 100 nm and equal to or smaller than 500 nm, for example. Due to the film thickness, the exposure of the first lower electrode 19 in an etching step of the photoelectric conversion layer 16 in manufacturing the photoelectric conversion panel 1 can be suppressed. Note that in the first embodiment, the film thickness of the second lower inorganic insulating film 105a is, for example, 350 nm.

In addition, the second lower inorganic insulating film 105a includes the groove 105c recessed toward the third inorganic insulating film 103 at a position outside the TFT 21 of the protection circuit 20 (at an opposite side to the pixel region R1) in the region R2. A lower end of the second lower inorganic insulating film 105a in the groove 105c is in contact with the upper surface of the third inorganic insulating film 103. The second moisture-proof portion 42 is disposed inside the groove 105c.

Configuration of Second Lower Electrode

The second lower electrode 13a is provided so as to cover the first opening of the second lower inorganic insulating film 105a and a part of the second lower inorganic insulating film 105a. The second lower electrode 13a is formed of titanium (Ti) having a resistance higher than that of aluminum (Al). A film thickness of the second lower electrode 13a is, for example, equal to or larger than 10 nm and equal to or smaller than 50 nm. This film thickness can suppress scatter of a part of the second lower electrode 13a in the etching step of the photoelectric conversion layer 16 in manufacturing the photoelectric conversion panel 1. Note that in the first embodiment, the film thickness of the second lower electrode 13a is 30 nm.

Configuration of Photoelectric Conversion Layer

The photoelectric conversion layer 16 is provided on the second lower electrode 13a. The photoelectric conversion layer 16 is formed by sequentially layering an n-type amorphous semiconductor layer 161, an intrinsic amorphous semiconductor layer 162, and a p-type amorphous semiconductor layer 163. The n-type amorphous semiconductor layer 161 is formed of amorphous silicon doped with n-type impurities (for example, phosphorus). The intrinsic amorphous semiconductor layer 162 is formed of intrinsic amorphous silicon. The intrinsic amorphous semiconductor layer 162 is formed so as to be in contact with the n-type amorphous semiconductor layer 161. The p-type amorphous semiconductor layer 163 is formed of amorphous silicon doped with p-type impurities (for example, boron). The p-type amorphous semiconductor layer 163 is formed so as to be in contact with the intrinsic amorphous semiconductor layer 162.

The upper electrode 13b is provided on the photoelectric conversion layer 16. For example, the upper electrode 13b is configured of indium tin oxide (ITO). That is, the photodiode 13 is formed at an upper layer than the third organic film 104.

Configuration of Second Upper Inorganic Insulating Film

The second upper inorganic insulating film 105b is provided so as to cover the photodiode 13 and at least a part of the second lower inorganic insulating film 105a. In addition, the second upper inorganic insulating film 105b covers the upper surface of the photodiode 13 and the side surface of the photodiode 13. The second upper inorganic insulating film 105b is a passivation film and a coating film of the photodiode 13, the first lower electrode 19, and the source connection electrode 11a.

Here, in the first embodiment, the second upper inorganic insulating film 105b is provided with the second hole portion 32. For example, the second upper inorganic insulating film 105b is formed so as to coat an inner side surface of the hole portion 32a of the second lower inorganic insulating film 105a to form the second hole portion 32 described above. According to this configuration, when the photoelectric conversion panel 1 is manufactured, heat for forming the photoelectric conversion layer 16 and the first organic film 106 is transferred to the third organic film 104, and even when gas is generated from the third organic film 104, the gas can be released to the first organic film 106 side through the second hole portion 32. Molecules of the gas are released through gaps of the bond network of the organic film. This suppresses accumulation of the gas between the third organic film 104, and the second lower inorganic insulating film 105a and the second upper inorganic insulating film 105b. As a result, even when the photoelectric conversion panel 1 includes the third organic film 104 and the first organic film 106, it can be suppressed that the second lower inorganic insulating film 105a and the second upper inorganic insulating film 105b leave away from the third organic film 104 in manufacturing the photoelectric conversion panel 1. Furthermore, the accumulation of gas between the third organic film 104 and the source connection electrode 11a and the first lower electrode 19 (the photodiode 13) can be suppressed. Thus, separation of the source connection electrode 11a from the third organic film 104 and separation of the photodiode 13 from the third organic film 104 can be suppressed.

Additionally, the contact hole CH2 is provided on the upper electrode 13b in the second upper inorganic insulating film 105b, and the contact hole CH6 is provided on the source connection electrode 11a. In addition, the second upper inorganic insulating film 105b includes the groove 105c recessed toward the third inorganic insulating film 103 at a position outside the TFT 21 of the protection circuit 20 (at an opposite side to the pixel region R1) in the region R2.

Configuration of First Organic Film

The first organic film 106 that is formed at an upper layer than the third organic film 104 to cover at least a part of the second upper inorganic insulating film 105b, and a part of which is filled into the second hole portion 32 is provided. The first organic film 106 is a flattening film that levels a stepped portion formed by the photodiode 13. In addition, the first organic film 106 is in contact with the third organic film 104 in the second hole portion 32, for example. The first organic film 106 is made of a material similar to that of the third organic film 104, for example. The first organic film 106 is made of organic transparent resin such as acrylic resin or siloxane resin. In the first embodiment, the first organic film 106 is made of photosensitive acrylic resin. According to this configuration, the third organic film 104 and the first organic film 106 that are made of the same material are connected through the second hole portion 32, and thus, the third organic film 104 and the first organic film 106 are easily stretched (flexible) between the upper and lower portions. Additionally, the contact hole CH2 and the contact hole CH6 are provided in the first organic film 106.

Configurations of Bias Wiring Line and Source Wiring Line

The bias wiring line 15 and the source wiring line 11 are provided on the first organic film 106. The bias wiring line 15 is in contact with the upper electrode 13b in the contact hole CH2. Additionally, the source wiring line 11 is in contact with the source connection electrode 11a in the contact hole CH6.

The bias wiring line 15 is connected to the controller 3 (see FIG. 1). The bias wiring line 15 applies a bias voltage input from the controller 3 to the upper electrode 13b through the contact hole CH2. The source wiring line 11 is connected to the controller 3 (see FIG. 1). When the TFT 14 is in the on state, a signal corresponding to electric charges converted in the photodiode 13 is output to the signal reading unit 3b through the source wiring line 11. The source wiring line 11 and the bias wiring line 15 are made of a layered metal film configured of, for example, Ti, aluminum, Ti, and ITO from the lower layer. Containing aluminum in the source wiring line 11 and the bias wiring line 15 contributes to lowering of resistances that are important for characteristics of wiring lines. Ti serves as a barrier layer that prevents surface oxidation of aluminum. Containing ITO in the source wiring line 11 and the bias wiring line 15 can form terminals for external mounting at the same layer. Note that when the source wiring line 11 and the bias wiring line 15, and the terminals for external mounting are not formed in the same layer, the source wiring line 11 and the bias wiring line 15 do not need to contain ITO.

Configuration of First Inorganic Insulating Film

The first inorganic insulating film 107 is provided on the first organic film 106 so as to cover the source wiring line 11 and the bias wiring line 15. The first inorganic insulating film 107 is made of, for example, silicon nitride (SiN). In addition, the first inorganic insulating film 107 is a passivation film. The first inorganic insulating film 107 includes the first hole portion 31 described above. Additionally, the first inorganic insulating film 107 is formed with the first moisture-proof portion 41 and the second moisture-proof portion 42 that have been described above.

Configuration of Second Organic Film

The second organic film 108 is provided so as to cover the first inorganic insulating film 107. The second organic film 108 is formed at an upper layer than the first organic film 106 to cover the first inorganic insulating film 107, and a part of the second organic film 108 is filled into each of the first hole portion 31, the first moisture-proof portion 41, and the second moisture-proof portion 42. The second organic film 108 is a protective film that protects the first inorganic insulating film 107 and the like. Additionally, the second organic film 108 is, for example, in contact with the first organic film 106 in the first hole portion 31. The second organic film 108 is made of a material similar to that of the first organic film 106, for example. The second organic film 108 is made of organic transparent resin such as acrylic resin or siloxane resin. In the first embodiment, the second organic film 108 is made of photosensitive acrylic resin.

Manufacturing Method of Photoelectric Conversion Panel

Figure 5:
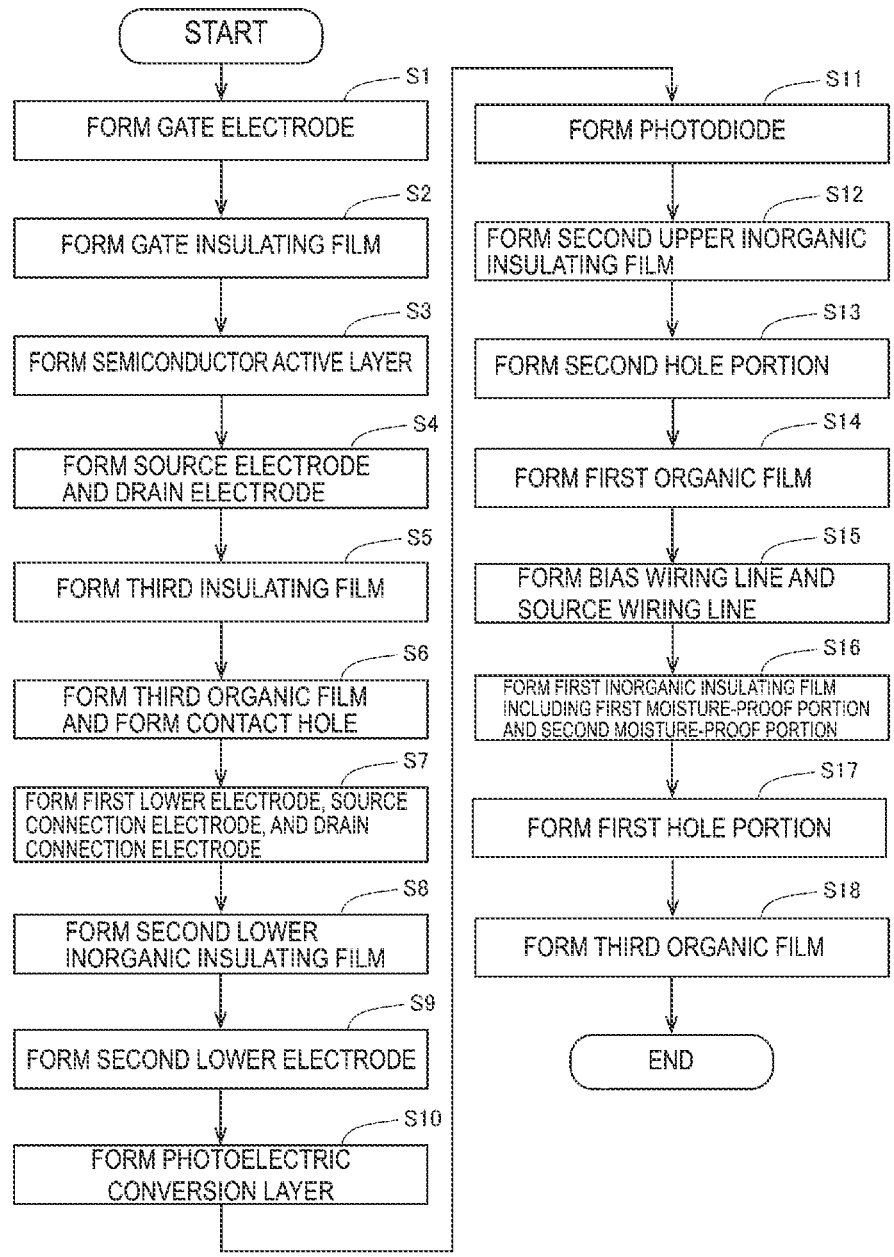
FIG. 5 is a flowchart for explaining a manufacturing process of the photoelectric conversion panel 1.

Next, a manufacturing method of the photoelectric conversion panel 1 will be described with reference to FIG. 4 and FIG. 5. FIG. 5 is a flowchart for explaining a manufacturing process of the photoelectric conversion panel 1.

As illustrated in FIG. 4 and FIG. 5, in step S1, the gate electrodes 14a and 21a are formed on the glass substrate 101. Specifically, a layered film made of tungsten (W) and tantalum nitride (TaN) is formed on the glass substrate 101, for example, by a sputtering method. Then, the gate electrode 14a is formed by performing a photolithography method and dry etching.

In step S2, the gate insulating film 102 is formed so as to cover the gate electrodes 14a and 21a. For example, by using a CVD method, a layered film of silicon oxide (SiOx) and silicon nitride (SiNx) is formed, thereby forming the gate insulating film 102.

In step S3, the semiconductor active layers 14b and 21b are respectively formed on the gate electrodes 14a and 21a with the gate insulating film 102 interposed therebetween. For example, an In—Ga—Zn—O based oxide semiconductor is formed by a sputtering method, and a photolithography method and dry etching are performed to form the semiconductor active layers 14b and 21b. In addition, although not illustrated, the photolithography method and the dry etching are performed in this step, thereby forming a gate contact.

In step S4, the source electrodes 14c and 21c and the drain electrodes 14d and 21d are formed. For example, a layered film layered such that two metal films made of titanium (Ti) sandwich a metal film made of aluminum (Al) is formed by a sputtering method, and a photolithography method and dry etching are performed to form the source electrodes 14c and 21c, and the drain electrodes 14d and 21d.

In step S5, the third inorganic insulating film 103 is formed on the gate insulating film 102, the source electrodes 14c and 21c, and the drain electrodes 14d and 21d. For example, an inorganic insulating film (single-layer film) made of silicon oxide ($SiO_2$) is formed by using a CVD method, and a photolithography method and dry etching are performed to form the third inorganic insulating film 103. Furthermore, in this step, the contact holes CH1, CH3, CH4, and CH5 are formed in the third inorganic insulating film 103.

The third organic film 104 is formed on the third inorganic insulating film 103 (at an upper layer than the TFT 14). For example, photosensitive acrylic resin is applied to the third inorganic insulating film 103 to form the third organic film 104. In addition, in this step, baking is performed (for example, a step of heating at 200 degrees). Then, a photolithography method and etching are performed to form the contact holes CH1, CH3, CH4 and CH5 in the third organic film 104 in this step. Additionally, an opening to be disposed with the groove 105c and the second moisture-proof portion 42 is formed in the third organic film 104.

In step S7, the first lower electrode 19, the source connection electrodes 11a and 22c, and the drain connection electrode 22d are formed on the third organic film 104. For example, a single-layer film made of aluminum (Al), or a layered film layered such that two metal films made of titanium (Ti) sandwich a metal film made of aluminum (Al) is formed by a sputtering method, and a photolithography method and dry etching are performed to form the first lower electrode 19, the source connection electrodes 11a and 22c, and the drain connection electrode 22d.

In step S8, the second lower inorganic insulating film 105a that covers a part of the first lower electrode 19 and a part of the third organic film 104 is formed on the first lower electrode 19. For example, an inorganic insulating film (single-layer film) made of silicon nitride (SiNx) is formed by using a CVD method, and a photolithography method and dry etching are performed to form the second lower inorganic insulating film 105*a*. Note that the second lower inorganic insulating film 105*a* may be made of silicon oxide (SiO$_2$) instead of silicon nitride (SiNx). In addition, in this step, the hole portion 32*a* is formed in the second lower inorganic insulating film 105*a*. Additionally, in this step, in the second lower inorganic insulating film 105*a*, an opening to be provided with the second lower electrode 13*a* is formed on the first lower electrode 19. Additionally, the contact hole CH6 to be provided with the source wiring line 11 is formed on the source connection electrode 11*a* in the second lower inorganic insulating film 105*a*. A film thickness of the second lower inorganic insulating film 105*a* is formed so as to have a size being, for example, equal to or larger than 100 nm and equal to or smaller than 500 nm. This film thickness can suppress the exposure of the first lower electrode 19 in the etching step of the photoelectric conversion layer 16.

In step S9, the second lower electrode 13*a* is formed so as to cover a part of the second lower inorganic insulating film 105*a*. For example, a metal film made of titanium (Ti) is formed by a sputtering method, and a photolithography method and dry etching are performed to form the second lower electrode 13*a*. Here, a peripheral portion other than a portion to be formed as the photoelectric conversion layer 16 is removed before the step of forming the photoelectric conversion layer 16 (step S10), and thus, in the step of forming the photoelectric conversion layer 16, scatter of a material toward the side surface (side wall) of the photoelectric conversion layer 16 can be suppressed. Also, for example, the second lower electrode 13*a* having a film thickness being equal to or larger than 10 nm and equal to or smaller than 50 nm is formed. Due to this film thickness, scatter of a part of the second lower electrode 13*a* can be suppressed in the etching step of the photoelectric conversion layer 16. Note that in the first embodiment, the film thickness of the second lower electrode 13*a* is 30 nm.

In step S10, the photoelectric conversion layer 16 is formed on the second lower electrode 13*a*. For example, by a CVD method, the n-type amorphous semiconductor layer 161 made of amorphous silicon doped with n-type impurities (for example, phosphorus), the intrinsic amorphous semiconductor layer 162 made of intrinsic amorphous silicon, and the p-type amorphous semiconductor layer 163 made of amorphous silicon doped with p-type impurities (for example, boron) are layered in order.

Then, the upper electrode 13*b* is formed on the photoelectric conversion layer 16. An ITO film is formed by, for example, a sputtering method. Then, a photolithography method and wet etching are performed to form the upper electrode 13*b*. Note that after forming the upper electrode 13*b*, treatment may be performed with hydrogen plasma or the like in order to repair damage caused by etching of the side wall of the photoelectric conversion layer 16. In this case, after forming the ITO film, a passivation film that covers the ITO film may be formed before the etching step.

In step S11, a photolithography method and dry etching are performed to form the photoelectric conversion layer 16, and the photodiode 13 is formed.

In step S12, the second upper inorganic insulating film 105*b* is formed so as to cover the photodiode 13 and at least a part of the second lower inorganic insulating film 105*a*. For example, an inorganic insulating film made of silicon nitride (SiNx) is formed by a CVD method, and a photolithography method and dry etching are performed to form the second upper inorganic insulating film 105*b*. Also, the groove 105*c* is formed.

In step S13, the second hole portion 32 is formed in the second upper inorganic insulating film 105*b*. Additionally, in this step, the contact hole CH2 is formed on the upper electrode 13*b* in the second upper inorganic insulating film 105*b*, and the contact hole CH6 is formed on the source connection electrode 11*a*.

In step S14, the first organic film 106 that covers at least a part of the second upper inorganic insulating film 105*b* at the upper layer than the third organic film 104, and a part of which is filled into the second hole portion 32 is formed. For example, photosensitive acrylic resin is applied to the second upper inorganic insulating film 105*b* to form the first organic film 106. In addition, in this step, baking of the first organic film 106 or the photosensitive acrylic resin (for example, a step of heating at 200 degrees) is performed. At this time, heat may also be transferred to the third organic film 104 to generate gas, but even when the gas is generated from the third organic film 104 because of the heat, the gas can be released to the first organic film 106 side through the second hole portion 32. It is considered that molecules of the gas are released through gaps of the bond network of the organic film. This suppresses the accumulation of the gas between the second lower inorganic insulating film 105*a* (and the second upper inorganic insulating film 105*b*) and the third organic film 104. As a result, separation of the second lower inorganic insulating film 105*a* (and the second upper inorganic insulating film 105*b*) from the third organic film 104 can be suppressed. Furthermore, the accumulation of gas between the third organic film 104 and the source connection electrode 11*a* and the first lower electrode 19 (the photodiode 13) can be suppressed. Thus, separation of the source connection electrode 11*a* from the third organic film 104 and separation of the photodiode 13 from the third organic film 104 can be suppressed. Then, a photolithography method and etching are performed to form the contact hole CH2 and the contact hole CH6 in the first organic film 106. Further, in the first organic film 106, an opening to be provided with the first moisture-proof portion 41 and an opening to be provided with the second moisture-proof portion 42 are formed.

In step S15, the bias wiring line 15 and the source wiring line 11 are formed on the first organic film 106. For example, an ITO film and a film made of titanium (Ti), aluminum (Al), and titanium (Ti) are formed by a sputtering method, and wet etching and dry etching are performed to form the bias wiring line 15 and the source wiring line 11.

In step S16, the first inorganic insulating film 107 is formed on the first organic film 106 so as to cover the source wiring line 11 and the bias wiring line 15. For example, an inorganic insulating film made of silicon nitride (SiNx) is formed by a CVD method, and a photolithography method and dry etching are performed to form the first inorganic insulating film 107. Additionally, in this step, the first moisture-proof portion 41 is formed so as to penetrate the first organic film 106, and the second moisture-proof portion 42 is formed in the groove 105*c*.

In step S17, the first hole portion 31 that connects the first organic film 106 and the second organic film 108 is formed in the first inorganic insulating film 107.

In step S18, the second organic film 108 is formed so as to cover the first inorganic insulating film 107. Additionally, the second organic film 108 is formed at an upper layer than the first organic film 106, and covers the first inorganic insulating film 107, and a part of the second organic film 108 is filled into the first hole portion 31. For example, photosensitive acrylic resin is applied to the second upper inorganic insulating film 105b to form the first organic film 106. In addition, in this step, baking is performed (for example, a step of heating at 200 degrees). At this time, gas generated from the first organic film 106 is released to the outside through the first hole portion 31 and the second organic film 108.

According to the manufacturing method described above, the entrance of hydrogen gas into the TFT 21 disposed at a lower layer than the first organic film 106 can be suppressed, so that characteristics of the TFT 21 can be prevented from changing. Then, the first organic film 106 is blocked by the first moisture-proof portion 41 at least a part of which is disposed at the photodiode 13 side than the first hole portion 31, and thus, even when moisture enters from the first hole portion 31, the moisture can be prevented from arriving at or in the photodiode 13. As a result, characteristics of the photodiode 13 can be prevented from changing.

Second Embodiment

Next, a configuration of an X-ray imaging device 200 according to a second embodiment will be described with reference to FIG. 6. Note that configurations similar to those of the first embodiment will be denoted by the same reference signs as those of the first embodiment, and descriptions thereof will be omitted.

Figure 6:
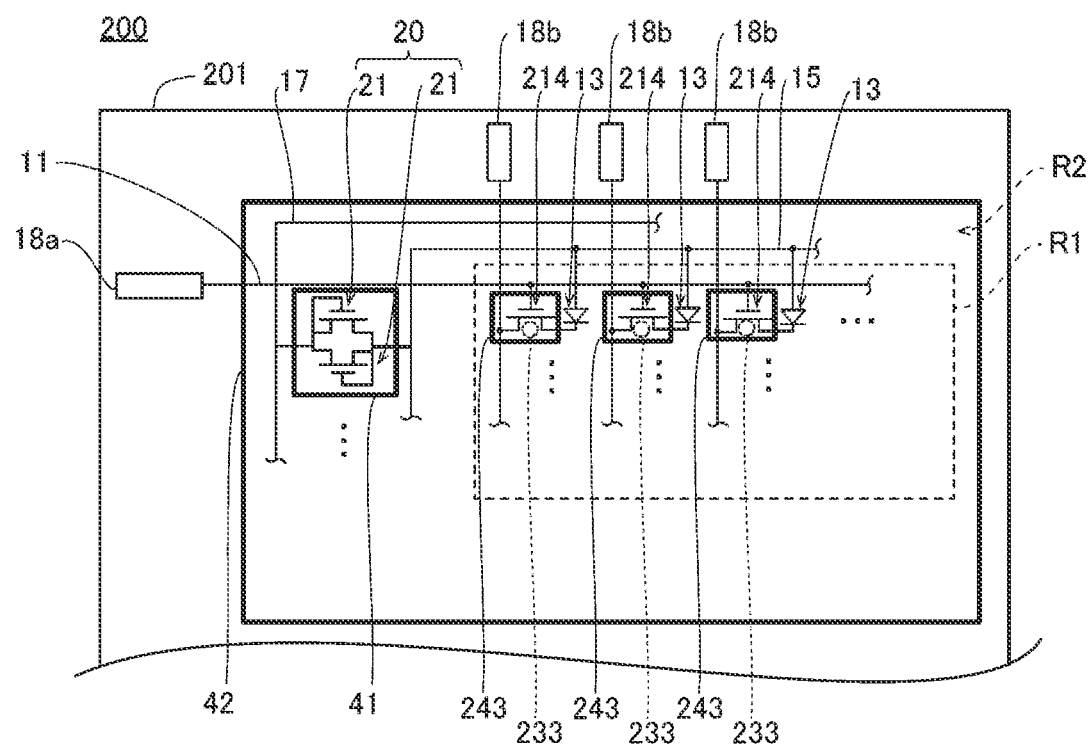
FIG. 6 is a diagram for explaining a part of a configuration of an X-ray imaging device 200 according to a second embodiment.

FIG. 6 is a diagram for explaining a part of the configuration of the X-ray imaging device 200 according to the second embodiment. In the second embodiment, a photoelectric conversion panel 201 includes a first inorganic insulating film 207. The first inorganic insulating film 207 is provided with a third moisture-proof portion 243 surrounding, in a plan view, each of a plurality of TFTs 214 disposed in the pixel region R1 and a third hole portion 233 disposed at a TFT 214 side in a plan view with respect to the third moisture-proof portion 243. The third hole portion 233 is disposed at an inner side of the third moisture-proof portion 243 having a frame shape in a plan view. The third hole portion 233 releases gas generated in the photoelectric conversion panel 201 and prevents characteristics of the TFT 214 from changing.

The third moisture-proof portion 243 prevents moisture entering from the third hole portion 233 from arriving at or in the photodiode 13. Note that the other configurations of the second embodiment are similar to the configurations of the first embodiment.

According to the configuration of the second embodiment, it is possible to prevent characteristics of the TFTs 214 in the pixel region R1, in addition to the TFT 21 in the protection circuit 20, from changing while preventing characteristics of the photodiode 13 from changing. Note that the other effects of the second embodiment are similar to the effects of the first embodiment.

Embodiments have been described above, but the embodiments described above are merely examples for implementing the disclosure. Thus, the disclosure is not limited to the embodiments described above and can be implemented by modifying the embodiments described above as appropriate without departing from the scope of the disclosure.

Figure 7:
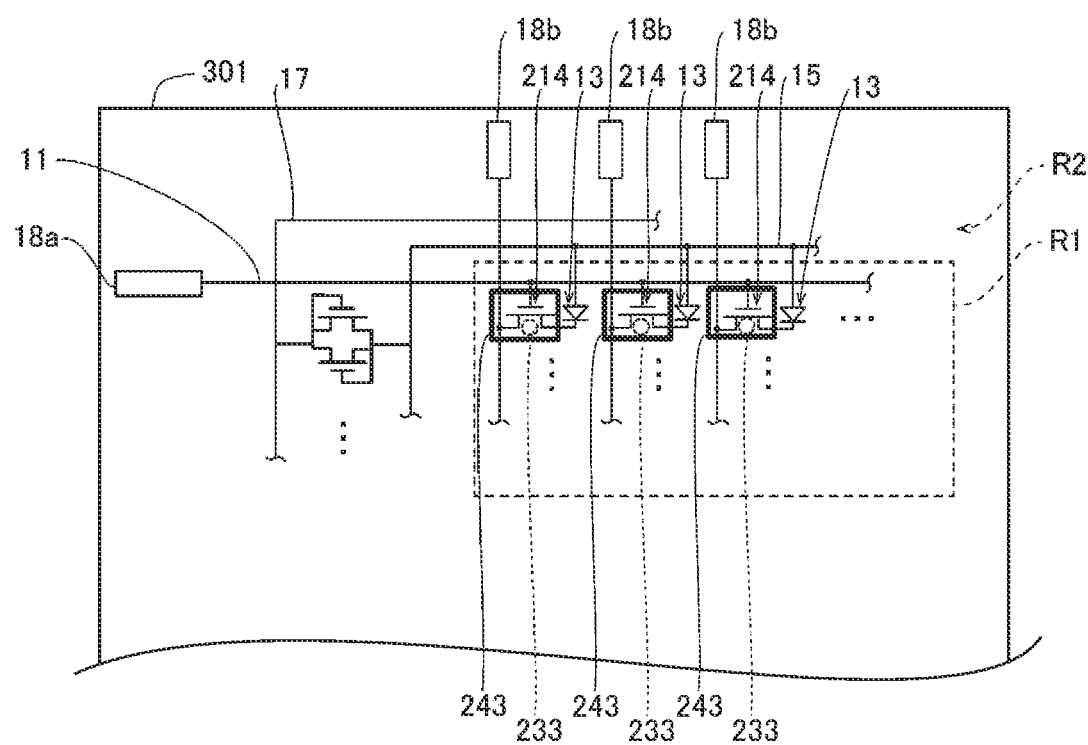
FIG. 7 is a diagram for explaining a part of a configuration of a photoelectric conversion panel 301 according to a modified example of the first and second embodiments.

(1) In the first and second embodiments described above, the examples are illustrated in which the first moisture-proof portion is provided so as to surround the TFT in the protection circuit, but the disclosure is not limited to these examples. For example, as in a photoelectric conversion panel 301 according to a modified example illustrated in FIG. 7, the moisture-proof portion (the third moisture-proof portion 243) surrounding the TFT 214 in the pixel region R1 may be provided without providing the first moisture-proof portion surrounding the TFT in the protection circuit.

(2) In the first and second embodiments described above, the examples are illustrated in which the second moisture-proof portion is provided in the photoelectric conversion panel, but the disclosure is not limited to these examples. For example, the second moisture-proof portion does not need to be provided as in the photoelectric conversion panel 301 in the modified example illustrated in FIG. 7.

(3) In the first and second embodiments described above, the examples are illustrated in which the photoelectric conversion panel is applied to an X-ray imaging panel for an X-ray imaging device, but the disclosure is not limited to these examples. That is, the photoelectric conversion panel described above may be applied to a panel for an optical sensor other than X-rays.

(4) In the first and second embodiments described above, the examples of the film thicknesses of the layers (films) constituting the photoelectric conversion panel, the materials, and the manufacturing method are illustrated, but the disclosure is not limited to these examples. That is, the layers (films) constituting the photoelectric conversion panel may be configured by adopting the film thicknesses, the materials, and the manufacturing method other than the examples described above. For example, the first organic film, the second organic film, and the third organic film may be configured of different organic materials from one another. Furthermore, the first inorganic insulating film, the second inorganic insulating film, and the third inorganic insulating film may be configured of different inorganic materials from one another. Furthermore, the TFT may be configured of a material other than the In—Ga—Zn—O based material (for example, silicon).

(5) In the first and second embodiments described above, the examples are illustrated in which the photoelectric conversion panel is provided with the second lower inorganic insulating film and the second upper inorganic insulating film, and the third organic film, but the disclosure is not limited to these examples. That is, at least one of the second lower inorganic insulating film and the second upper inorganic insulating film, and the third organic film do not need to be provided in the photoelectric conversion panel.

(6) In the first and second embodiments described above, the examples are illustrated in which each of the first moisture-proof portion, the second moisture-proof portion, and the third moisture-proof portion is formed in the frame shape in the plan view, but the disclosure is not limited to these examples. For example, at least one of the first moisture-proof portion, the second moisture-proof portion, and the third moisture-proof portion may be formed in a linear shape, an L shape, or an arc shape in a plan view.

(7) In the first and second embodiments described above, the examples are illustrated in which the second upper inorganic insulating film is coated on the inner side surface of the opening of the second lower inorganic insulating film in the second hole portion, but the disclosure is not limited to these examples. For example, after the second lower inorganic insulating film and the second upper inorganic insulating film are formed, a portion to be formed as the second hole portion may be collectively removed to form the second hole portion.

(8) In the first and second embodiments described above, the examples are illustrated in which the groove is provided in each of the first moisture-proof portion, the second moisture-proof portion, and the third moisture-proof portion, and the second organic film is filled into the groove, but the disclosure is not limited to these examples. The grooves do not need to be provided in the first moisture-proof portion, the second moisture-proof portion, and the third moisture-proof portion (the first inorganic insulating film itself may be filled in the groove).

The photoelectric conversion panel, the X-ray imaging panel, and the manufacturing method of the photoelectric conversion panel that have been described above may be described as in the following.

A photoelectric conversion panel according to a first configuration includes a substrate, a thin film transistor disposed on the substrate, a photoelectric conversion element disposed at an upper layer than the thin film transistor, a first organic film formed at an upper layer than the photoelectric conversion element, a first inorganic insulating film covering at least a part of the first organic film, and a second organic film covering at least a part of the first inorganic insulating film, and the first inorganic insulating film includes a first hole portion connecting the first organic film and the second organic film, and a first moisture-proof portion at least a part of which is disposed at a side of the photoelectric conversion element with respect to the first hole portion, the first moisture-proof portion penetrating the first organic film (the first configuration).

According to the first configuration, even when hydrogen gas is generated from the first organic film in manufacturing the photoelectric conversion panel or an X-ray imaging panel, the hydrogen gas can be released through the first hole portion provided in the first inorganic insulating film to an upper layer than the first inorganic insulating film. This can suppress the hydrogen gas from entering into the thin film transistor disposed at a lower layer than the first organic film, and thus, can prevent characteristics of the thin film transistor from changing. In addition, since the first organic film is blocked by the first moisture-proof portion at least a part of which is disposed at the photoelectric conversion element side than the first hole portion, the moisture can be prevented from arriving at or in the photoelectric conversion element even when the moisture enters from the first hole portion. As a result, characteristics of the photoelectric conversion element can be prevented from changing.

In the first configuration, the first moisture-proof portion may have a frame shape surrounding at least the first hole portion in a plan view (a second configuration).

According to the second configuration described above, the moisture that has entered into the first organic film through the first hole portion can be prevented from entering into a region outside the first moisture-proof portion having the frame shape.

In the first or second configuration, the first inorganic insulating film may further include a second moisture-proof portion penetrating the first organic film, the second moisture-proof portion having a frame shape surrounding at least the first moisture-proof portion and the photoelectric conversion element in a plan view (a third configuration).

According to the third configuration described above, the moisture that has entered from an outer periphery of the photoelectric conversion panel can be blocked by the second moisture-proof portion, and thus, changing in the characteristics of the photoelectric conversion element due to the moisture that has entered from the outer periphery of the photoelectric conversion panel can be prevented.

In any one of the first to third configurations, the photoelectric conversion panel may further include a third organic film formed at an upper layer than the thin film transistor and a lower layer than the photoelectric conversion element, a lower electrode covering a lower surface of the photoelectric conversion element, the lower electrode being connected to the thin film transistor, and a second inorganic insulating film covering an upper surface and a side surface of the photoelectric conversion element, the second inorganic insulating film covering at least a part of the third organic film, the first organic film may cover at least a part of the second inorganic insulating film, the second inorganic insulating film may include a second hole portion connecting the first organic film and the third organic film, and at least a part of the first moisture-proof portion may be disposed at a side of the photoelectric conversion element with respect to the second hole portion, and may be in contact with the second inorganic insulating film (a fourth configuration).

According to the fourth configuration described above, the second hole portion is provided in the second inorganic insulating film, and thus, hydrogen gas generated from the third organic film can be released to an upper layer than the second inorganic insulating film through the second hole portion. Furthermore, even when the second hole portion is provided in the second inorganic insulating film, moisture that has entered into the third organic film through the second hole portion is blocked by the lower electrode before arriving at or in the photoelectric conversion element, and thus, changing in the characteristics of the photoelectric conversion element due to the moisture can be prevented.

In the fourth configuration, the first moisture-proof portion may include a groove recessed from a height position where the first hole portion is disposed, toward the second inorganic insulating film, and a part of the second organic film may be disposed in the groove (a fifth configuration).

According to the fifth configuration described above, by forming the first inorganic insulating film after removing a portion of the first organic film at a position where the first moisture-proof portion is formed, the first moisture-proof portion including the groove can be easily formed.

In the fourth or fifth configuration, the photoelectric conversion panel may further include a protection circuit disposed in a region outside a pixel region disposed with the photoelectric conversion element within the substrate, the protection circuit being covered with the second inorganic insulating film, the thin film transistor may be disposed in the protection circuit, the first moisture-proof portion may be disposed in a manner of surrounding the thin film transistor in the protection circuit in a plan view, and the first hole portion may be disposed at a side of the thin film transistor with respect to the first moisture-proof portion (a sixth configuration).

Here, the number per area (a density) of the thin film transistors in the region outside the pixel region is smaller than the number per area (a density) of the thin film transistors in the pixel region. Thus, intervals between a plurality of thin film transistors at the outside of the pixel region increase. Thus, the second inorganic insulating film covering the thin film transistor in the protection circuit is formed with an inclined portion (a portion having a taper shape) because of covering the thin film transistor. Due to the inclined portion, a thickness of the second inorganic insulating film covering the thin film transistor may be thin, or the thin film transistor may be exposed to the second inorganic insulating film (the coverage may become poor). When the coverage is poor, hydrogen gas generated from the first organic film may arrive at or in the thin film transistor beyond the second inorganic insulating film, and characteristics of the thin film transistor may change. In contrast, according to the sixth configuration described above, the hydrogen gas can be released by the first hole portion, and thus, the characteristics of the thin film transistor in the protection circuit can be prevented from changing. Then, since the first hole is disposed at an inner side than the first moisture-proof portion surrounding the thin film transistor in the protection circuit in a plan view, moisture that has entered through the first hole portion can be prevented from arriving at or in the photoelectric conversion element beyond the first moisture-proof portion.

In the sixth configuration, the photoelectric conversion panel may further include a pixel thin film transistor disposed in the pixel region, and the first inorganic insulating film may further include a third moisture-proof portion surrounding the pixel thin film transistor in a plan view, and a third hole portion disposed at a side of the pixel thin film transistor with respect to the third moisture-proof portion (a seventh configuration).

According to the seventh configuration described above, it is possible to further prevent characteristics of the pixel thin film transistor from changing while preventing characteristics of the photoelectric conversion element from changing.

In any one of the first to seventh configurations, the thin film transistor includes an In—Ga—Zn—O based oxide semiconductor (an eighth configuration).

According to the eighth configuration described above, the photoelectric conversion panel including the thin film transistor having high speed performance can be provided.

An X-ray imaging panel according to a ninth configuration includes the photoelectric conversion panel according to any one of the first to eighth configurations, and a scintillator overlapping the photoelectric conversion panel (the ninth configuration).

According to the ninth configuration described above, the X-ray imaging panel capable of preventing characteristics of both the thin film transistor and the photoelectric conversion element from changing can be provided.

A manufacturing method of a photoelectric conversion panel according to a tenth configuration includes forming a thin film transistor on a substrate, forming a photoelectric conversion element at an upper layer than the thin film transistor, forming a first organic film at an upper layer than the photoelectric conversion element, forming a first inorganic insulating film covering at least a part of the first organic film, forming a first hole portion in the first inorganic insulating film, and forming a second organic film covering at least a part of the first inorganic insulating film and connecting the second organic film and the first organic film in the first hole portion, and the forming of the first inorganic insulating film includes forming a first moisture-proof portion at least a part of which is disposed at a side of the photoelectric conversion element with respect to the first hole portion, the first moisture-proof portion penetrating the first organic film (the tenth configuration).

According to the tenth configuration described above, the manufacturing method of the photoelectric conversion panel capable of preventing characteristics of both the thin film transistor and the photoelectric conversion element from changing can be provided.

In the tenth configuration, the manufacturing method further includes forming a third organic film covering the thin film transistor after the forming of the thin film transistor and before the forming of the photoelectric conversion element, forming a contact hole in the third organic film, forming a lower electrode covering a lower surface of the photoelectric conversion element, the lower electrode being connected to the thin film transistor through the contact hole, forming a second inorganic insulating film covering an upper surface and a side surface of the photoelectric conversion element, the second inorganic insulating film covering at least a part of the third organic film, after the forming of the photoelectric conversion element, and forming a second hole portion connecting the first organic film and the third organic film in the second inorganic insulating film, after the forming of the second inorganic insulating film and before the forming of the first organic film, and the forming of the first moisture-proof portion includes forming the first moisture-proof portion at least a part of which is disposed at a side of the photoelectric conversion element with respect to the second hole portion, a bottom portion of the first moisture-proof portion being in contact with the second inorganic insulating film (an eleventh configuration).

According to the eleventh configuration described above, the second hole portion is provided in the second inorganic insulating film, and thus, in the forming of the first organic film, when moisture gas is generated from the third organic film, the moisture gas can be released to an upper layer than the second inorganic insulating film through the second hole portion. Furthermore, even when the second hole portion is provided in the second inorganic insulating film, moisture that has entered into the third organic film through the second hole portion is blocked by the lower electrode before arriving at or in the photoelectric conversion element, and thus, changing in the characteristics of the photoelectric conversion element due to the moisture can be prevented.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

The invention claimed is:

1. A photoelectric conversion panel comprising:
a substrate;
a thin film transistor disposed on the substrate;
a photoelectric conversion element disposed at an upper layer than the thin film transistor;
a first organic film formed at an upper layer than the photoelectric conversion element;
a first inorganic insulating film covering at least a part of the first organic film; and
a second organic film covering at least a part of the first inorganic insulating film,
wherein the first inorganic insulating film includes a first hole portion connecting the first organic film and the second organic film, and
a first moisture-proof portion at least a part of which is disposed at a side of the photoelectric conversion element with respect to the first hole portion, the first moisture-proof portion penetrating the first organic film.

2. The photoelectric conversion panel according to claim 1,
wherein the first moisture-proof portion has a frame shape surrounding at least the first hole portion in a plan view.

3. The photoelectric conversion panel according to claim 1,
wherein the first inorganic insulating film further includes a second moisture-proof portion penetrating the first organic film, the second moisture-proof portion having a frame shape surrounding at least the first moisture-proof portion and the photoelectric conversion element in a plan view.

4. The photoelectric conversion panel according to claim 1, further comprising:
- a third organic film formed at an upper layer than the thin film transistor and a lower layer than the photoelectric conversion element;
- a lower electrode covering a lower surface of the photoelectric conversion element, the lower electrode being connected to the thin film transistor; and
- a second inorganic insulating film covering an upper surface and a side surface of the photoelectric conversion element, the second inorganic insulating film covering at least a part of the third organic film,
- wherein the first organic film covers at least a part of the second inorganic insulating film,
- the second inorganic insulating film includes a second hole portion connecting the first organic film and the third organic film, and
- at least a part of the first moisture-proof portion is disposed at a side of the photoelectric conversion element with respect to the second hole portion, and is in contact with the second inorganic insulating film.

5. The photoelectric conversion panel according to claim 4,
- wherein the first moisture-proof portion includes a groove recessed from a height position where the first hole portion is disposed, toward the second inorganic insulating film, and
- a part of the second organic film is disposed in the groove.

6. The photoelectric conversion panel according to claim 4, further comprising:
- a protection circuit disposed in a region outside a pixel region disposed with the photoelectric conversion element within the substrate, the protection circuit being covered with the second inorganic insulating film,
- wherein the thin film transistor is disposed in the protection circuit,
- the first moisture-proof portion is disposed in a manner of surrounding the thin film transistor in the protection circuit in a plan view, and
- the first hole portion is disposed at a side of the thin film transistor with respect to the first moisture-proof portion.

7. The photoelectric conversion panel according to claim 6, further comprising:
- a pixel thin film transistor disposed in the pixel region,
- wherein the first inorganic insulating film further includes a third moisture-proof portion surrounding the pixel thin film transistor in the plan view, and
- a third hole portion disposed at a side of the pixel thin film transistor with respect to the third moisture-proof portion.

8. The photoelectric conversion panel according to claim 1,
- wherein the thin film transistor includes an In—Ga—Zn—O based oxide semiconductor.

9. An X-ray imaging panel comprising:
- the photoelectric conversion panel according to claim 1; and
- a scintillator overlapping the photoelectric conversion panel.

* * * * *